United States Patent [19]
Cho et al.

[11] Patent Number: 5,789,293
[45] Date of Patent: Aug. 4, 1998

[54] NONVOLATILE MEMORY DEVICE AND MANUFACTURING METHOD THEREOF

[75] Inventors: Myoung-kwan Cho; Keon-soo Kim, both of Kyungki-do, Rep. of Korea

[73] Assignee: Samsung Electronics Co., Ltd., Suwon, Rep. of Korea

[21] Appl. No.: 757,247

[22] Filed: Nov. 27, 1996

Related U.S. Application Data

[62] Division of Ser. No. 619,360, Mar. 21, 1996.

[30] Foreign Application Priority Data

Mar. 31, 1995 [KR] Rep. of Korea .............. 95-7590

[51] Int. Cl.[6] ............................... H01L 21/336
[52] U.S. Cl. .................. 438/257; 438/266; 438/258
[58] Field of Search .................. 437/43, 52; 438/257, 438/258, 266

[56] References Cited

U.S. PATENT DOCUMENTS

| | | | |
|---|---|---|---|
| 4,367,580 | 1/1983 | Guterman | 29/571 |
| 5,403,764 | 4/1995 | Yamamoto et al. | 437/43 |
| 5,445,987 | 8/1995 | Kuroda et al. | 437/43 |
| 5,451,355 | 9/1995 | Chan et al. | 437/43 |
| 5,472,892 | 12/1995 | Gwen et al. | 437/43 |
| 5,506,159 | 4/1996 | Enomoto | 437/52 |
| 5,518,947 | 5/1996 | Noda | 437/52 |
| 5,538,912 | 7/1996 | Kunori et al. | 437/52 |

*Primary Examiner*—John Niebling
*Assistant Examiner*—Michael S. Lebentritt
*Attorney, Agent, or Firm*—Cushman Darby & Cushman IP Group of Pillsbury Madison & Sutro LLP

[57] ABSTRACT

A nonvolatile memory device and a manufacturing method thereof is disclosed. The device includes a gate electrode of a memory cell arranged in a memory cell region and having a floating gate electrode formed of a first conductive layer, an insulating film formed on the floating gate electrode and a control gate electrode formed of a second conductive layer on the insulating film; a gate electrode formed of a second conductive layer and arranged in a peripheral circuit region surrounding the memory cell region; a resistance device formed of the first conductive layer arranged in a boundary region between the memory cell region and the peripheral circuit region and/or the peripheral circuit region; an insulating film formed on a part of a surface of the resistance device; and a capping layer formed of the second conductive layer on the insulating film. Thus, generation of a stringer can be prevented so that malfunction of a device can be prevented.

2 Claims, 7 Drawing Sheets

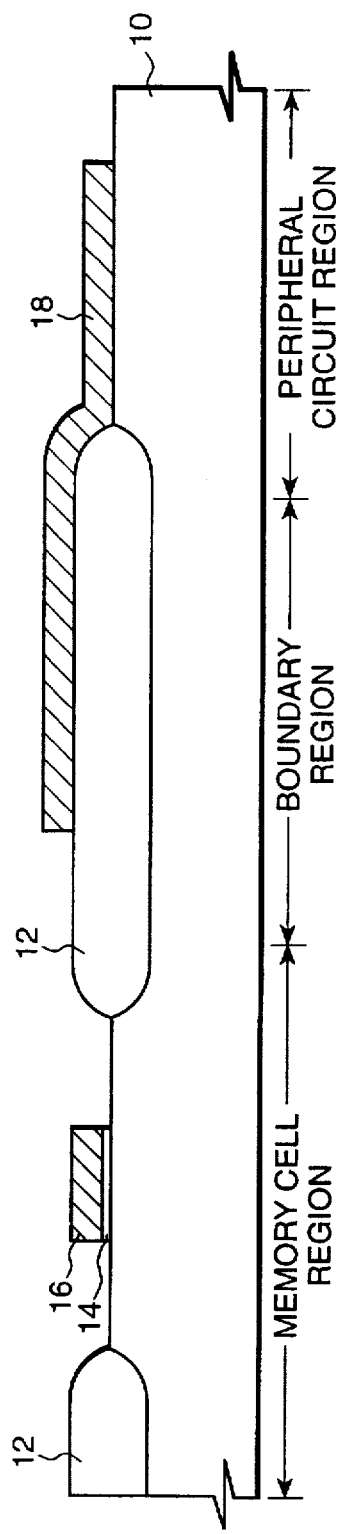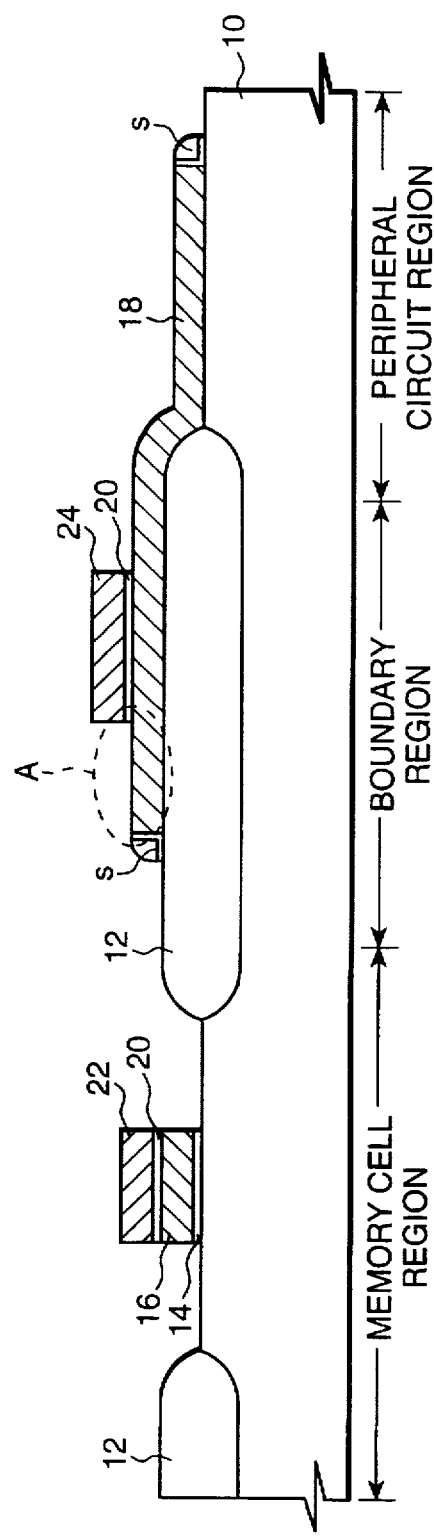

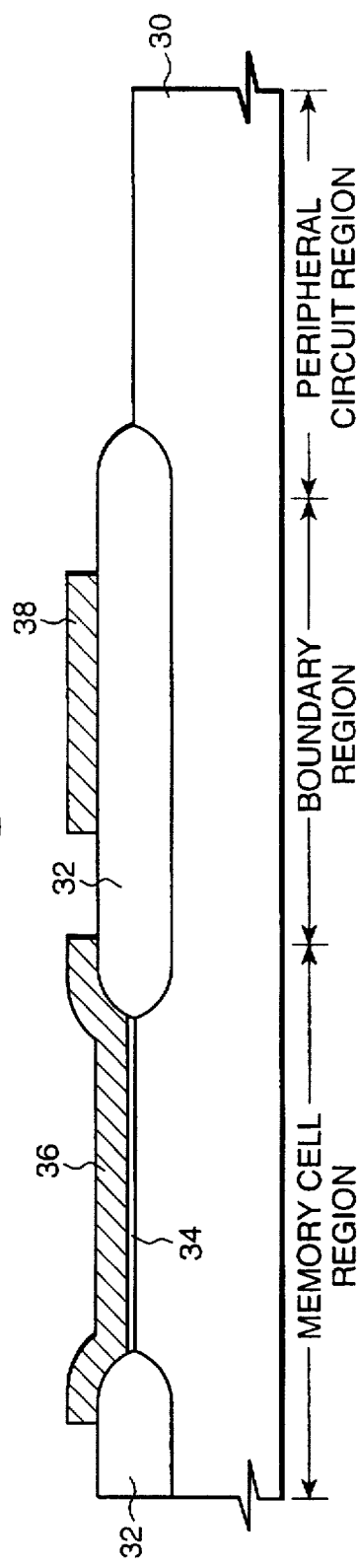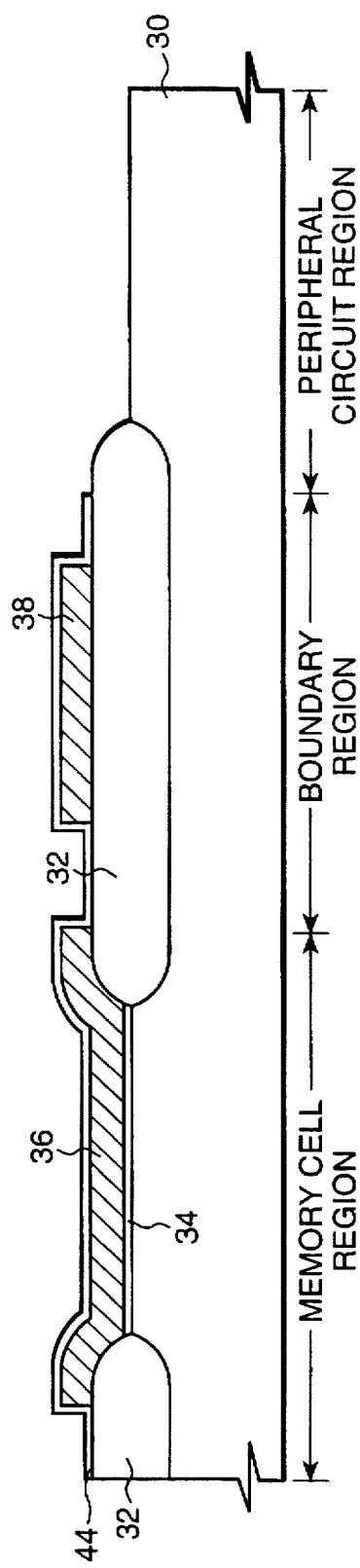

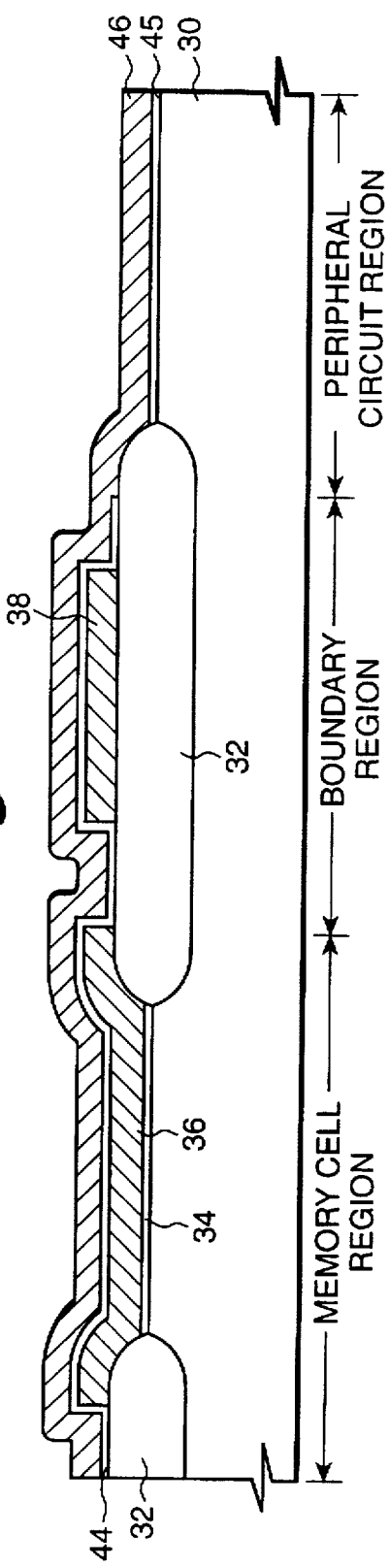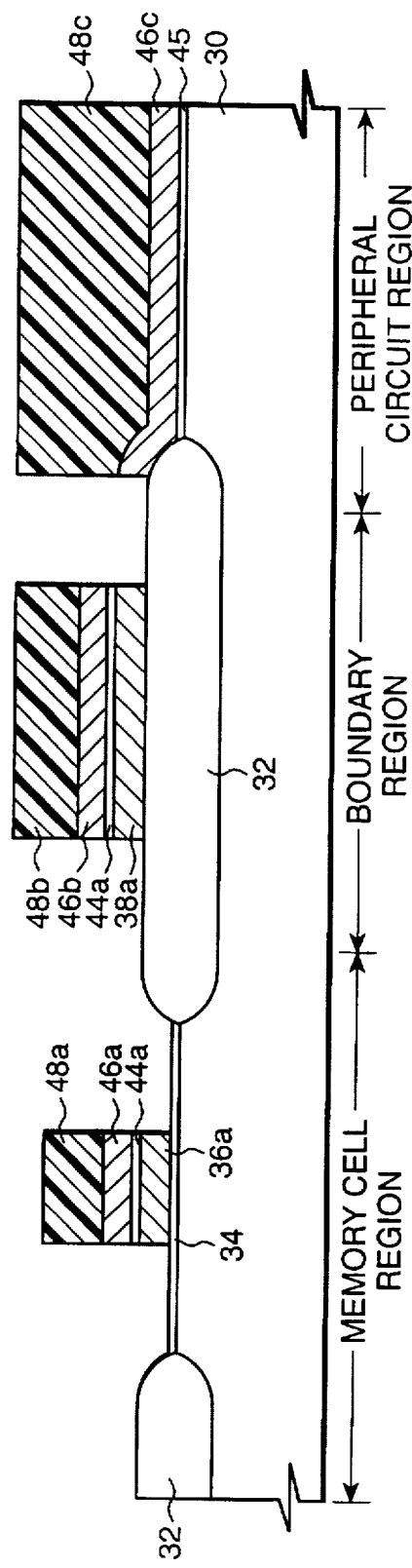

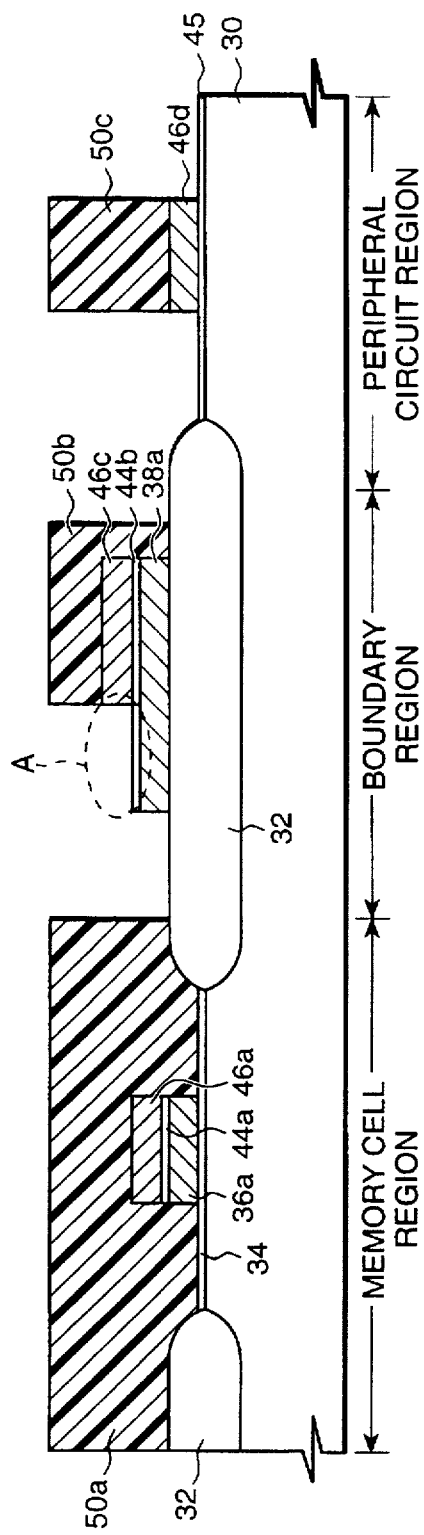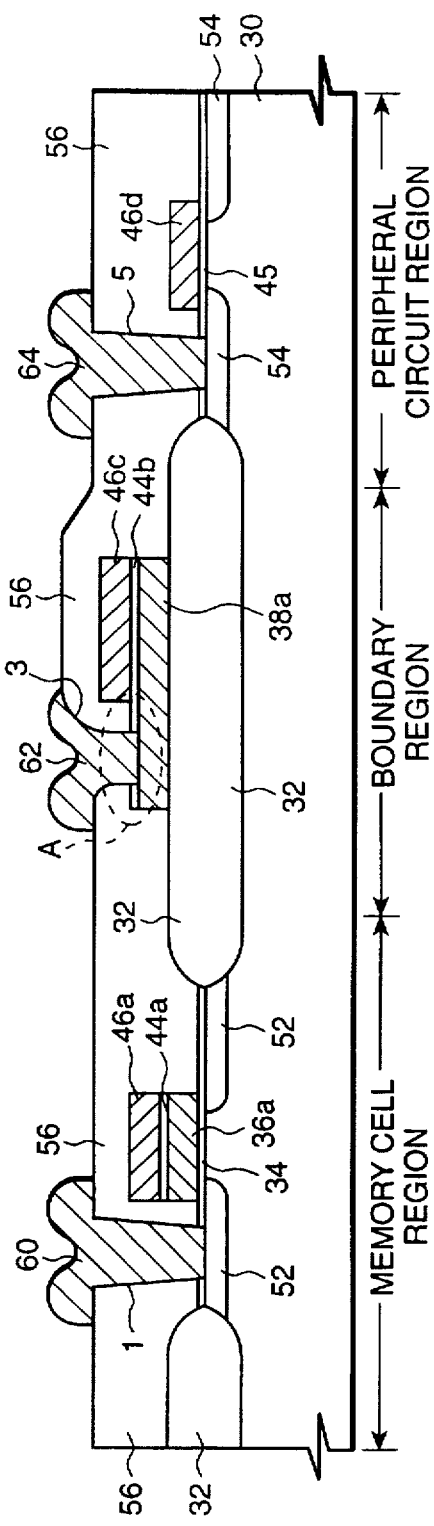

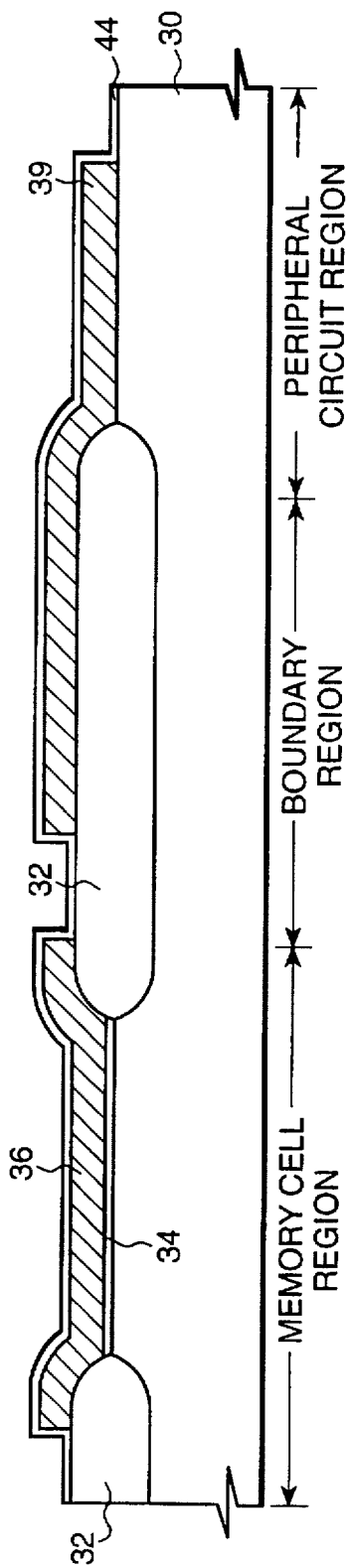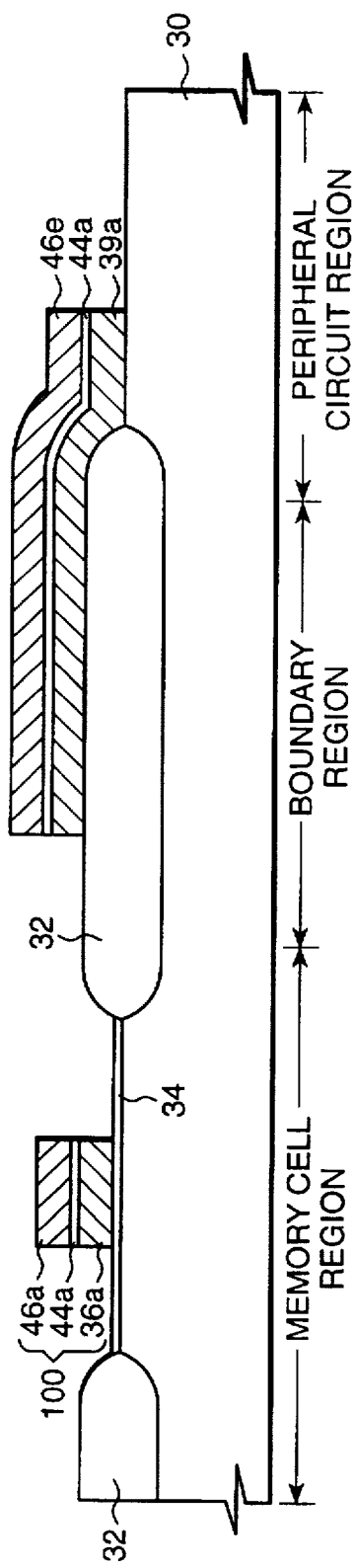

NONVOLATILE MEMORY DEVICE AND MANUFACTURING METHOD THEREOF

This is a division of application No. 08/619,360, filed Mar. 21, 1996.

BACKGROUND OF THE INVENTION

The present invention relates to a semiconductor memory device and a manufacturing method thereof, and more particularly to a nonvolatile memory device and a manufacturing method thereof.

A manufacturing method of a nonvolatile memory device, including a nonvolatile memory cell having a floating gate and a resistance device for driving the cell using the two-layer polysilicon process, is disclosed in U.S. Pat. No. 4,367,580 issued to Daniel C. Guterman of Houston, Tex., FIGS. 1A and 1B are sectional views for illustrating a conventional manufacturing method of a resistance device of a nonvolatile memory.

Device isolation film 12 for defining an active region is formed on semiconductor substrate 10, and then silicon oxide film 14 for insulating semiconductor substrate 10 from floating gate 16 is formed. First polysilicon is deposited on the resultant having silicon oxide film 14, and then impurities for controlling the resistance are doped therein. Resistance device 18, formed in the peripheral circuit and boundary regions, and floating gate 16, formed in the memory cell region, are formed by patterning the first polysilicon (see FIG. 1A).

Interlayer dielectric film 20 for insulating the first polysilicon from a second polysilicon is coated on the resultant structure having floating gate 16 and resistance device 18, and then the second polysilicon is deposited on the interlayer dielectric film. Subsequently, capping layer 24 for covering resistance 18 and control gate 22 for forming a memory cell are formed by etching the second polysilicon and the interlayer dielectric film (see FIG. 1B).

As shown in FIG. 1B, region "AA" indicates a contact region for connecting the resistance to other devices.

In the case of forming the capping layer in the above-mentioned manner, residue remaining in the sidewall of the patterned first polysilicon (i.e., of resistance device 18) forms a stringer (S) causing malfunction of the device.

In the case of anisotropically etching the second polysilicon, it is difficult to completely eliminate the deposited second polysilicon from the sidewall of resistance device 18, while the second polysilicon deposited on resistance device 18 is being completely patterned.

Besides, when the first polysilicon is used as gate electrodes of the peripheral circuit (not shown), a stringer exists on the sidewall of the gate electrode of the peripheral circuit, thus the device malfunctions.

SUMMARY OF THE INVENTION

Accordingly, it is an object of the present invention to provide a nonvolatile memory device which is not subject to the above described malfunction.

It is another object of the present invention to provide a manufacturing method for the nonvolatile memory device.

To accomplish the above object of the present invention, there is provided a nonvolatile memory device comprising: a gate electrode of a memory cell arranged in a memory cell region and having a floating gate electrode formed of a first conductive layer, an insulating film formed on the floating gate electrode and a control gate electrode formed of a second conductive layer on the insulating film; a gate electrode formed of a second conductive layer and arranged in a peripheral circuit region surrounding the memory cell region; a resistance device formed of the first conductive layer arranged in a boundary region between the memory cell region and the peripheral circuit region and/or the peripheral circuit region; an insulating film formed on a part of a surface of the resistance device; and a capping layer formed of the second conductive layer on the insulating film.

It is preferable that the first and second conductive layers are formed of polysilicon.

To accomplish another object of the present invention, there is provided a manufacturing method of a nonvolatile memory device comprising the steps of: forming a first conductive layer on a semiconductor substrate; forming a floating gate pattern in a memory cell region and a resistance pattern in a peripheral circuit region surrounding the memory cell region and/or a boundary region between the memory cell region and the peripheral circuit region by patterning the first conductive layer; forming an insulating film on the floating gate and the resistance pattern; forming a gate insulating film on the peripheral circuit region; forming a second conductive layer on the whole surface of the resultant structure having the gate insulating film; forming a gate electrode of a nonvolatile memory device in the memory cell region and a resistance device in the peripheral circuit region and/or the boundary region by etching the second conductive layer, the insulating film and the first conductive layer; and forming a capping layer partially exposing a surface of the resistance device and a gate electrode of the peripheral circuit region by patterning the second conductive layer formed on the resistance device and said peripheral circuit region.

To accomplish another object of the present invention, there is also provided a manufacturing method of a nonvolatile memory device comprising the steps of: forming a first conductive layer on a semiconductor substrate; forming a floating gate pattern in a memory cell region and a resistance pattern in a peripheral circuit region surrounding the memory cell region and/or a boundary region between the memory cell region and the peripheral circuit region by patterning the first conductive layer; forming an insulating film on the floating gate pattern and the resistance pattern; forming a second conductive layer over the resultant structure having the insulating film; forming a gate electrode of a nonvolatile memory device in the memory cell region and a second conductive layer and a resistance device in the peripheral circuit region and/or the boundary region by simultaneously etching the second conductive layer, the insulating film and the first conductive layer; and forming a capping layer exposing a surface of the resistance device by patterning the second conductive layer formed on the resistance device.

It is preferable that the first and second conductive layers are formed of polysilicon.

Accordingly, it is possible to prevent malfunction of the device due to a stringer formed on the sidewall of a resistance device and on the sidewall of a gate electrode in the peripheral circuit region.

BRIEF DESCRIPTION OF THE DRAWINGS

The above objects and advantages of the present invention will become more apparent by describing in detail a preferred embodiment thereof with reference to the attached drawings in which:

3

Figure 2:
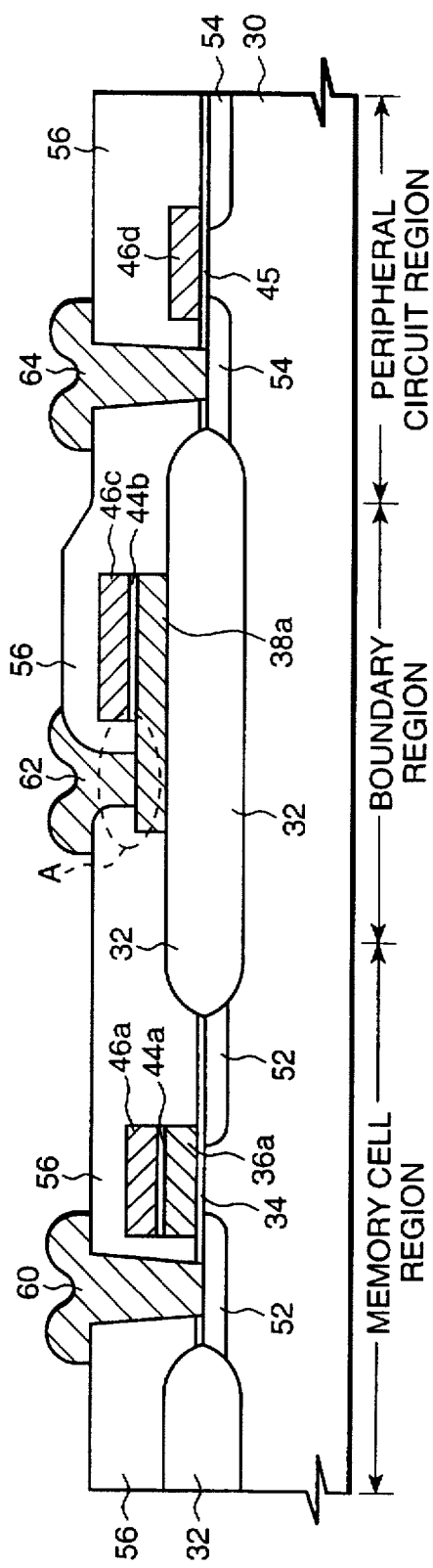
Figure 4C:
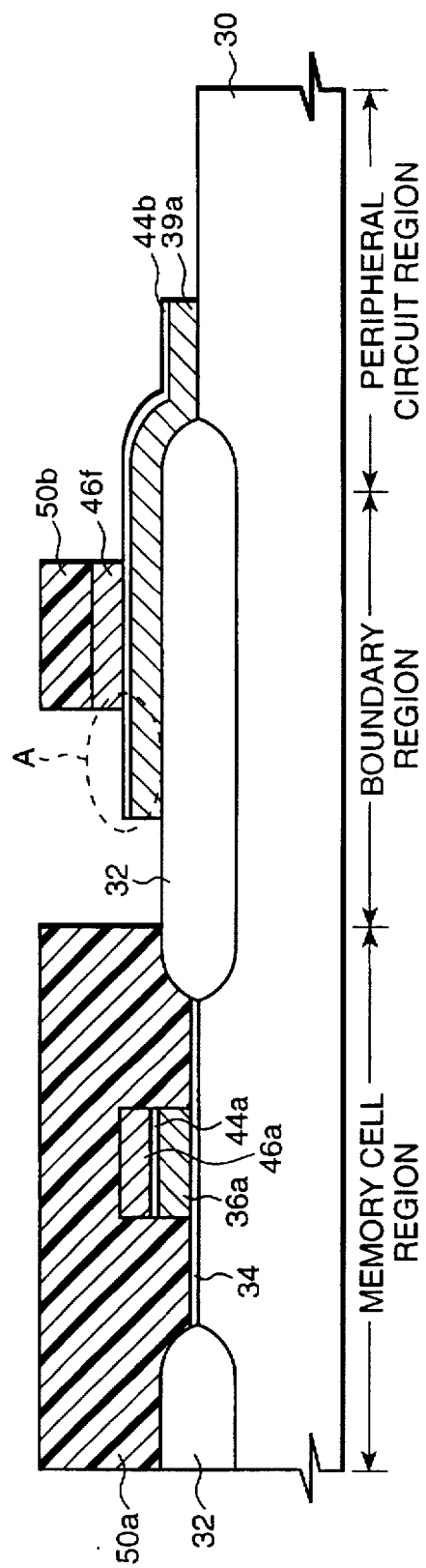

FIGS. 1A and 1B are sectional views for illustrating a manufacturing method of a resistance of a conventional nonvolatile memory device;

FIG. 2 is a sectional view of a nonvolatile memory device according to the present invention;

FIGS. 3A through 3F are sectional views for illustrating a manufacturing method of a nonvolatile memory device according to an embodiment of the present invention; and FIGS. 4A through 4C are sectional views for illustrating a manufacturing method of a nonvolatile memory device according to another embodiment of the present invention.

DETAILED DESCRIPTION OF THE INVENTION

In the case of forming a resistance device by doping impurities into polysilicon, a capping layer for preventing impurity diffusion from other devices is preferably formed on the resistance device such that a desired resistance value is uniformly maintained until manufacturing of the device is completed.

The present invention is directed to preventing the problems inherently generated by conventional methods in forming the capping layer on the resistance device.

Device

As shown in FIG. 2, a nonvolatile memory device is sectioned into a memory cell region, a peripheral circuit region, surrounding the memory cell region, and a boundary region between the memory cell region and the peripheral circuit region.

Reference numeral 36a indicates a floating gate, 44a and 44b indicate insulating films, 46a indicates a control gate, 46c indicates a capping layer, 46d indicates a gate electrode of the peripheral circuit and 38a indicates a resistance device.

The memory cell region has nonvolatile memory cells including source/drain 52 and a gate electrode provided with floating gate 36a, which is formed of a first conductive layer, insulating film 44a formed on the floating gate and control gate 46a formed of a second conductive layer on the insulating film 44a. A cell electrode 60 is connected to source/drain 52.

The boundary region has resistance device 38a, which is formed of the first conductive layer on device isolation film 32, insulating film 44b and capping layer 46c, which are accumulated on the resistance device such that a part of a surface of the resistance device is left exposed. A resistance electrode 62 is connected to the resistance device through contact region "A".

The peripheral circuit region has a transistor including gate electrode 46d, formed of the first conductive layer, a gate insulating film 45 and source/drain 54. Peripheral circuit electrode 64 is connected to source/drain 54 of the transistor.

According to the present invention, a stringer is not formed on the sidewall of a resistance device and on the sidewall of the gate electrode of the peripheral circuit transistor.

Manufacturing method

Embodiment 1

FIGS. 3A through 3F are sectional views for illustrating the manufacturing method for the nonvolatile memory device according to one embodiment of the present invention.

FIG. 3A shows a process of forming floating gate pattern 36 and resistance pattern 38. Here, the process is comprised of the first step of forming device isolation film 32 defining

4 an active region of the device on p-type semiconductor substrate 30, the second step of forming silicon oxide film 34 for insulating the floating gate (not shown) from semiconductor substrate 30, the third step of forming a first conductive layer which becomes floating gate pattern 36 and resistance pattern 38 by the following step (not shown) on the whole surface of the resultant substrate and then implanting impurities, and the fourth step of forming floating gate pattern 36 in a memory cell region and resistance pattern 38 in the other regions, i.e., a peripheral circuit region and/or a boundary region by patterning the first conductive layer.

Silicon oxide film 34 is formed through thermal oxidation to a thickness of, for example, 100 Å. The first conductive layer is formed by using, for example, polysilicon. The first conductive layer is formed to a thickness of, for example, 1,500 Å.

In the third step of forming the first conductive layer on the whole surface of the resultant substrate and then implanting impurities, the first conductive layer is doped with impurity such as $POCl_3$ in order to obtain a sheet resistance of approximately 50 Å/□. Here, the resistance value is determined by the amount of the implanted impurity during the third step.

FIG. 3B shows a process of forming insulating film 44. Here, the process is comprised of the first step of depositing a first oxide film/ a silicon nitride film/ a second oxide film (ONO) on the whole surface of the resultant where floating gate pattern 36 and resistance pattern 38 are formed, and the second step of forming insulating film 44 by eliminating the films deposited in the peripheral circuit region.

The insulating film 44 is formed in order to insulate the first conductive layer from the second conductive layer. The first oxide film is formed to a thickness of approximately 130 Å through dry thermal oxidation at, for example, 950° C. The silicon nitride film is deposited to a thickness of, for example, 150 Å. The second oxide film is formed to a thickness of approximately 50 Å through wet thermal oxidation at, for example, 1,000° C.

FIG. 3C shows the process of forming gate insulating film 45 and second conductive layer 46. Here, the process is comprised of the first step of forming gate insulating film 45 on the semiconductor substrate of the peripheral circuit region and the second step of forming the second conductive layer on the whole surface of the resultant from the first step.

Gate insulating film 45 is formed to a thickness of, for example, 200 Å through thermal oxidation. Second conductive layer 46 is formed by depositing, for example, polysilicon to a thickness of approximately 1,500 Å.

After depositing the second conductive layer, in order to lower the resistance of the second conductive layer, an impurity such as $POCl_3$ is doped to obtain sheet resistance of 50Ω/□. In order to further lower the resistance of the second conductive layer, a silicide layer such as tungsten silicide is deposited to a thickness of approximately 1,500 Å.

FIG. 3D shows the process of forming the gate of the nonvolatile memory device and resistance device. The process comprises of the first step of forming photosensitive film pattern 48a for forming a control gate in the memory cell region, photosensitive film pattern 48b for forming the resistance device in the boundary region, and photosensitive film pattern 48c covering all of the peripheral circuit region, by coating and developing a photosensitive film on the second conductive layer, and the second step of forming the gate of the nonvolatile memory device consisting of an floating gate 36a, an insulating film 44a and control gate 46a in the memory cell region and resistance device 38a in the boundary region by isotropically etching the second conductive layer, the insulating film and the first conductive layer using the photosensitive pattern as an etching mask. Here, the resistance device is covered with insulating film 44b and capping layer pattern 46b.

FIG. 3E shows the process of forming capping layer 46c and gate electrode 46d of the peripheral circuit region. The process comprises of the first step of eliminating the formed photosensitive film patterns in FIG. 3D, the second step of forming photosensitive film pattern 50a covering all of the memory cell region, photosensitive film pattern 50b for exposing contact region "A" which connects the resistance device to other devices in the boundary region and photosensitive film region 50c for forming a gate electrode in the peripheral circuit region by covering and developing a photosensitive film on the whole surface of the resultant substrate, and the third step of forming capping layer 46c in the boundary region and gate electrode 46d in the peripheral circuit region by etching the second conductive layer using the photosensitive patterns as an etching mask.

The contact region "A" is for connection with other devices by a successive process.

Here, during the etching process for forming capping layer 46c which exposes contact region "A", a stringer is not generated on the sidewall of resistance device 38a, since the second conductive layer formed on the sidewall of the resistance device has been eliminated by the etching of the second step of FIG. 3D.

A stringer is not also generated on the sidewall of gate electrode 46d, since the gate electrode is formed by the second conductive layer unlike the conventional method where a gate electrode is formed by the first conductive layer.

FIG. 3F shows the process of forming cell electrode 60, resistance electrode 62 and peripheral circuit electrode 64. The the process comprises the first step of forming source/drain 52 of the nonvolatile memory cell in the memory cell region and source/drain 54 of a transistor in the peripheral region by doping impurities on the whole surface of the obtained resultant from FIG. 3E, the second step of forming interlayer dielectric film 56 by coating an insulating material on the whole surface of the resultant substrate, the third step of forming contact hole 1 for exposing source/drain 52 of the nonvolatile memory cell in the memory cell region, contact hole 3 for exposing contact region "A" in the boundary region and contact hole 5 for exposing source/drain 54 of a transistor in the peripheral circuit region by partly etching interlayer dielectric film 56, and the fourth step of forming cell electrode 60 in the memory cell region and resistance electrode 62 in the boundary region and peripheral circuit electrode 64 in the peripheral circuit region.

Interlayer dielectric film 56 is formed by depositing an insulating material such as boron phosphorus silicate glass (BPSG) to a thickness of approximately 6,000 Å and planarizing the deposited insulating material by heat-treatment performed for about 30 minutes under a nitride atmosphere of 900° C.

The resistance device formed in the boundary region of the first embodiment can be formed on other regions, which is also within the scope of the present invention.

Embodiment 2

FIGS. 4A through 4C are sectional views for illustrating the manufacturing method of a nonvolatile memory device according to another embodiment of the present invention, where the reference numerals in the second embodiment identify identical parts as in the first embodiment.

Unlike the first embodiment, a process of forming a transistor in the peripheral circuit region is omitted in this embodiment.

Floating gate pattern 36 and resistance pattern 39, which are formed of the first conductive layer, are formed in the memory cell region and in the other regions, respectively, and then insulating film 44 is formed on the whole surface of the resultant structure having floating gate pattern 36 and resistance pattern 38 (see FIG. 4A).

Subsequently, the second conductive layer is deposited on insulating film 44, and then the second conductive layer, the insulating film and the first conductive layer are etched, so that gate 100 of the nonvolatile memory device is formed in the memory cell region, and resistance device 39a is formed in the other regions (see FIG. 4B).

Then, capping layer 46f for exposing contact region "A" is formed by partly etching the insulating film and the second conductive layer which are accumulated on the resistance device 39a (see FIG. 4C).

According to the present invention, it is possible to form a gate of the nonvolatile memory device having the accumulated first conductive layer and second conductive layer and the resistance device formed by the first conductive layer without generating a stringer, so that malfunction of the completed devices can be prevented.

It should be understood that the invention is not limited to the illustrated embodiment and that many changes and modifications can be made within the scope of the invention by a skilled person in the art.

What is claimed is:

1. A manufacturing method of a nonvolatile memory device comprising the steps of:

forming a first conductive layer on a semiconductor substrate;

forming a floating gate pattern in a memory cell region and a resistance pattern in a boundary region between said memory cell region and a peripheral circuit region by patterning said first conductive layer;

forming an insulating film on said floating gate and said resistance pattern;

forming a gate insulating film on said peripheral circuit region;

forming a second conductive layer on the insulating film and the gate insulating film;

forming a gate electrode of a nonvolatile memory device in said memory cell region and a resistance device in said boundary region by etching said second conductive layer, insulating film and first conductive layer; and forming a capping layer exposing a surface of said resistance device, and forming a gate electrode of said peripheral circuit region wherein said forming of said capping layer and said gate electrode of said peripheral circuit region is provided by patterning said second conductive layer formed on said resistance device and said peripheral circuit region.

2. A manufacturing method of a nonvolatile memory device according to claim 1, wherein said first and second conductive layers are formed of polysilicon.

* * * * *